United States Patent [19]

Briguet et al.

[11] Patent Number: 4,684,890

[45] Date of Patent: Aug. 4, 1987

[54] PROCESS FOR THE GENERATION AND PROCESSING OF SIGNALS FOR OBTAINING BY NUCLEAR MAGNETIC RESONANCE A DISTORTION-FREE IMAGE FROM A HETEROGENEOUS POLARIZATION FIELD

[75] Inventors: André Briguet, Villeurbanne; Maurice Goldman, Massy, both of France

[73] Assignee: Commissariat a l'Energie Atomique, Massy, France

[21] Appl. No.: 804,045

[22] Filed: Dec. 3, 1985

[30] Foreign Application Priority Data

Dec. 12, 1984 [FR] France .................................. 84 18997

[51] Int. Cl.⁴ .......................................... G01R 33/20
[52] U.S. Cl. .................................... 324/309; 324/312; 324/311
[58] Field of Search ................ 324/307, 309, 312, 311; 364/413, 414

[56] References Cited

FOREIGN PATENT DOCUMENTS 0123200 10/1984 European Pat. Off. .
85/05693 12/1985 PCT Int'l Appl. ................. 324/312
2079946 1/1982 United Kingdom .

OTHER PUBLICATIONS

Cho et al., "Fourier Transform Nuclear Magnetic Resonance Tomographic Imaging", Proceedings of the IEEE, vol. 70, No. 10, Oct. 1982.

Lai, "Reconstructing NMR Images Under Magnetic Fields with Large Inhomogeneities", Journal of Physics E: Scientific Instruments, vol. 15, No. 10, Oct. 1982.

Sekihara et al., "Image Restoration from Non-Uniform Magnetic Field Influence for Direct Fourier NMR Imaging", Physics in Medicine and Biology, vol. 29, No. 1, Jan. 1984.

Primary Examiner—Stewart J. Levy
Assistant Examiner—Kevin D. O'Shea
Attorney, Agent, or Firm—Oblon, Fisher, Spivak, McClelland & Maier

[57] ABSTRACT

Process for the generation and processing of signals for obtaining a nuclear magnetic resonance image, which is free from distortions, from an inhomogeneous polarization field $B=Bo+E(x,y,z)$ using known 2D,FT and 3D,FT image coding methods involving the application of a 90° radiofrequency pulse in plane xOy, then a phase coding during time $\tau$ followed by frequency coding by applying, along Ox, a reading gradient during the acquisition of the free precession signal, which is then made to undergo Fourier transformations with respect to time and with respect to the gradient or gradients applied.

During a second series of sequences involving the successive application of the same gradients, the free precession system is subject to a second 180° radiofrequency pulse at the start of establishing each reading gradient.

3 Claims, 18 Drawing Figures

PROCESS FOR THE GENERATION AND PROCESSING OF SIGNALS FOR OBTAINING BY NUCLEAR MAGNETIC RESONANCE A DISTORTION-FREE IMAGE FROM A HETEROGENEOUS POLARIZATION FIELD

BACKGROUND OF THE INVENTION

The present invention relates to imaging by the nuclear magnetic resonance method (NMR) which is at present undergoing rapid development, particularly for the examination of the human body. It makes it possible to obtain images or pictures of the body which have a quality and accuracy which have not been obtained hitherto with conventional X-ray radiology methods. It applies to the phase of building up the image obtained by spatial coding and calculation with the aid of a computer.

The NMR imaging method uses the nuclear magnetic resonance property of certain nuclei present in the human body, essentially the protons distributed in any organism, and certain nuclei which are much less abundant but of biological interest, such as phosphorus $^{31}p$, potassium $^{39}K$ and sodium $^{23}Na$. By forming a chart or map of their concentration at each point of the volume examined, it is possible to produce images of living tissues, particularly from the hydrogen contained in water and the lipids forming the two essential components of any living matter.

A medical NMR installation is essentially comprised of a magnet for producing a static, uniform magnetic polarization field $\vec{Bo}$ throughout the zone of the body to be examined and on this is superimposed with the aid of an auxiliary coil, radiofrequency field pulses in a plane perpendicular to the direction of field $\vec{Bo}$.

The images are obtained by usually resonating the hydrogen nuclei or protons contained in the biological tissues. This resonance is possible because each proton behaves like a microscopic magnet and the radifrequency field is equivalent to two fields rotating in reverse directions and whereof that turning in the precession direction of the spins is capable of coupling therewith. When the static field $\vec{Bo}$ is applied, the spins are all oriented parallel to the axis of the field. Thus, there are no more than two possible orientations, namely in the direction of the field or in the opposite direction. Moreover nothing happens on applying the radiofrequency field at a random frequency. However, if said field is chosen equal to or very close to $f_o$ (Larmor frequency), such that $2\pi f_o = \gamma B_o$, in which $\gamma$ is a physical constant characterizing the nuclei which it is wished to resonate and called the gyromagnetic ratio, the coupling of the spins and the rotary field reaches a value such that the latter resonate.

The resonance signal detected during their return to equilibrium in free precession is proportional to the magnetization $\vec{M}$ of the nuclei placed in the magnetic polarization field $\vec{Bo}$. Observation of the resonance phenomenon requires the presence of a high magnetic field (0.1 to 1 Tesla), which is very uniform throughout the volume to be imaged.

Reference will now be made to a certain number of known phenomena and reference will be made to a certain number of conventions facilitating the understanding of the remainder of the text. Firstly the volume to be imaged will be referenced with respect to a trirectangular trihedron O,x,y,z in which the axis Oz is, by convention, parallel to the d.c. polarization field $\vec{Bo}$. In this hypothesis, the macroscopic magnetization vector $\vec{M}$ of the medium to be imaged is, in the inoperative state, parallel to axis Oz and the radiofrequency field $B_1$ rotating at the angular velocity $\omega_o$ will be in plane x,o,y, which is also that in which the resonance signal is collected.

In order to describe these various phenomena, it is often necessary to use a reference system x',O,y', x turning around Oz at angular frequency or ripple $\omega_o$ (FIGS. 1 and 2) and in this reference system $\vec{B_1}$ is aligned with Ox'.

A radiofrequency pulse at the Larmor frequency $f_o$ directed along axis Ox' has the property of rotating the macroscopic magnetization vector $\vec{M}$ by an angle $\theta$ about Ox in plane y'Oz, such that $\theta = \gamma B_1 t$, in which $\gamma$ is the gyromagnetic ratio, $B_1$ the modulus of the radiofrequency field and t the time during which said field is applied.

In NMR methods, particular use is made of pulses in which $\theta = 90°$ and $\theta = 180°$, called respectively the 90° pulse and the 180° pulse. These two pulse types respectively have the following properties.

The 90° pulses along Ox' will tilt vector $\vec{M}$ along axis Oy', as can be seen in FIG. 1. On the basis of this initial position, vector $\vec{M}$ precesses in plane xOY, also with ripple $\omega_o = 2\pi fo$ like $\vec{B_1}$ and this is the movement which induces the resonance signal at the Larmor frequency and this is detected with the aid of a not shown coil placed in said plane xOy.

At the instant of applying a 90° pulse along Ox', all the magnetic moments of the different nuclei are brought into phase along Oy' and vector $\vec{M}$ has its maximum modulus M along Oy'. As time passes, there is a dispersion of the magnetic moments in accordance e.g. with two components $M_1$ and $M_2$ rotating in opposite directions in plane x'Oy' relative to Oz taking place under the double influence of the inhomogeneity or heterogeneity of the field $B = B_o + E(x,y,z)$ and interactions between the nuclei. It is the transverse relaxation phenomenon which leads to the resulting moment M decreasing with a time constant $T_2$ so that $|\vec{M}| = M \cdot e^{-t/T_2}$ and the resonance signal is cut out.

The 180° pulses have the double property of realizing a population inversin of the spins by placing the macroscopic magnetization vector Mo in its antiparallel position and performing a symmetrical transformation with respect to the direction of said pulse, in the manner of the image in a plane mirror, of the magnetization vectors existing at the time of the pulse. Thus, in the case where the 180° radiofrequency pulse is directed along Oy', this changes to $-\theta$ the phases $\phi$ of the vectors $M_1$ and $M_2$ which are then mutually interchanged and changes $\phi$ into $(\pi - \phi)$ in the case where said 180° pulse is directed like $B_1$ along Ox', and $\vec{M_1}\vec{M_2}$ then taking the places of $\vec{M_3}$ and $\vec{M_4}$.

A description will now be given of the known methods for obtaining a NMR image of a living organism by calculation. If the d.c. polarization field $\vec{Bo}$ is perfectly homogeneous, all the magnetization vectors $\vec{M}$ from the different points of the volume to be imaged are in phase and it is impossible in the total signal received:

$$s(t) = \iiint_{xyz} M(x,y,z) e^{-t/T_2} \, dx \, dy \, dz$$

to attribute to each point a particular frequency and intensity. In order to be able to identify the contribution to this total signal of each elementary volume, there is a frequency coding of the space to be imaged by superimposing on field Bo additional fields varying linearly along one of the coordinates, so that the component $\vec{Bz}$ has constant spatial gradients $(\partial Bz/\partial x)$, $(\partial Bz/\partial y)$ and $(\partial Bz/\partial z)$ along x, y and z satisfying the three following equations:

$$Bz(x) = \frac{\partial Bz}{\partial x} \cdot x = G_x \cdot x$$

$$Bz(y) = \frac{\partial Bz}{\partial y} \cdot y = G_y \cdot y$$

$$Bz(z) = \frac{\partial Bz}{\partial z} \cdot z = G_z \cdot z$$

in which Bo+Bz is the component of the d.c. polarization field along Oz and Gx, Gy, Gz are the three constant gradients of the resulting induction along Ox, Oy and Oz. In NMR imaging it is standard, but not completely correct usage to call these additional fields "linear gradients" and this term will be used throughout the remainder of the present text.

The sought objective of these linear gradients is readily apparent. The Larmor frequency or ripple $\omega = \epsilon B$ is at all points of the volume to be imaged proportional to the induction at this point, so that spatial coding of this volume in phase and in frequency takes place and it is possible to show that the Fourier transform of the time signal s(t) or frequency spectrum $s(\omega)$ of said same signal is the three-dimensional image of the magnetization density sample, because in the presence of a linear gradient the frequency represents the coordinate along which said gradient is applied. For illustration purposes, FIG. 3 shows the distribution of vector $B_z$ in the case of a linear gradient $G_x$ in direction Ox. This is the method for building up the image called the direct Fourier method. It is applicable to three-dimensional imaging or 3D,FT and two-dimensional imaging or 2D,FT and a brief description will now be given of the principle, because it is to this imaging method that the present invention specifically applies.

Three-dimensional direct Fourier method (3D,FT)

FIG. 4 shows the evolution in time on the abscissa of the various fields applied to the volume to be imaged and of the magnetic resonance signal of the protons received.

Graph 1 shows the 90° radiofrequency pulse, which triggers off an analysis sequence of the volume to be imaged by starting the transverse relaxation process of the magnetization M and its free precession movement at the Larmor frequency about direction Oz parallel to the d.c. polarization field Bo. During a time $\tau$ following said pulse, in the manner shown in graphs 2 and 3, linear gradients Gz and Gy are applied and effect a phase coding in these two directions at each point of the volume, the phase displacements acquired in this way by magnetization M (x,y,z) being writable in complex notation $e^{i\gamma Gz \cdot z \cdot \tau}$ and $e^{i\gamma Gy \cdot y \cdot \tau}$. The different gradients $G_z$ and $G_y$ are applied by increasing values of $-G$ and $+G$ and, for each value of a gradient $G_z$, are successively applied all the gradients $G_y$ from $-G_y$ to $+G_y$ which, if N and N' are respective number of gradients $G_z$ and $G_y$ applied, gives a number of measurements equal to $N \times N'$.

At the end of each phase coding in z and y, for time $\tau_x$ gradient $G_x$ or the reading gradient is applied in the manner shown in graph 4 and the resonance signal shown in graph 5 is then collected. On assuming the polarization field to be homogeneous, this signal is in form:

$$s(t) = \iiint_{xyz} M(x,y,z) e^{-t/T_2} \cdot e^{i\gamma Gy \cdot y \cdot \tau} \cdot e^{i\gamma Gz \cdot z \cdot \tau} \cdot$$

$$e^{i\gamma G_x \cdot x \cdot t} \cdot dx \cdot dy \cdot dz$$

in which the two first exponential functions represent the phase displacements acquired by the magnetization vector $\vec{M}$ during phase coding and the third phase displacement acquired during the acquisition of the signal.

In a random order, it is then on signal s(t) that the three Fourier transforms are performed with respect to $G_z$ to $G_y$ and at time t in order to obtain in per se known manner using a computer, the spatial distribution of the magnetization of the different points of the volume to be imaged in the form of a complex three-dimensional image having a "real" volume and an "imaginary" volume.

Two-dimensional direct Fourier method (2D,FT)

FIG. 5 shows the evolution in time, on the abscissa, of the same quantities as in FIG. 4 and using the same graphs 1 to 5.

However, in this method use is made of the first gradient $G_z$ for defining, in the volume to be imaged, a section perpendicular to Oz, of thickness $\Delta z = 2\pi/\gamma Gz\tau z$ centred on dimension $zo = (2-\pi fo - \gamma B)Gz$ and in which working then takes place in accordance with the two coordinates x and y. This selective section is obtained by associating for time $\tau z$ (FIG. 5) a 90° radiofrequency pulse RF with the mean frequency fo and the linear gradient $$Gz = \frac{\partial B_z}{\partial z}$$

as shown in graphs 1 and 2.

As in the three-dimensional method, this is followed by a phase coding period with the gradients Gy of duration $\tau y$ and a frequency coding period with the gradient Gx of duration $\tau x$, during which acquisition also takes place of signal $$s(t) = \iint_{x,y} M(x,y) e^{-t/T_2} e^{i\gamma Gy \cdot y \cdot \tau y} \cdot e^{i\gamma Gx \cdot x \cdot t} dx \cdot dy$$

in which the two exponential functions represent the phase displacements obtained during the phase coding and frequency coding by the different magnetization vectors $\vec{M}$ of the section examined.

The two Fourier transformations relative to Gy and relative to time t then take place and make it possible to obtain a complex analytical signal with a "real" image and an "imaginary" image of the spatial distribution of the magnetization in the selected section and therefore a sectional image of said same section.

The complete theory of the principles of nuclear magnetic resonance and its application to medical imaging are more particularly described in the following works: Shaw, D., Fourier Transform NMR Spectroscopy, Elsevier, Amsterdam, 1976; Farrar, T. C. and Becker, E. C., Pulse and Fourier Transform NMR, Academic Press, 1971; Abragam, A., The Principles of Nuclear Magnetism, Oxford University Press (Clarendon), London, 1961; Mansfield, P. and Morris, P. G., NMR Imaging in Biomedicine, Academic Press, 1982; Kaufman L., Crooks, L. E. and Margulis, A. R., Nuclear Magnetic Resonance Imaging in Medicine Igaku-Shoin, New-York, Tokyo, 1981, chapters 1 and 2.

The known theory of NMR imaging described briefly hereinbefore, however, presupposes a perfect homogeneity of the polarization field Bo applied which, in practice, is never completely achieved and leads to serious, costly errors for the hitherto known NMR installations.

Thus, on representing the polarization field by the function $B(x,y,z) = Bo + E(x,y,z)$ in which $E(x,y,z)$ represents the inhomogeneity of the field at point $(x,y,z)$ with respect to the desired Bo, it is necessary to complete the aforementioned writing of signal s(t) received by two exponential functions in factor with the functions given hereinbefore and which are written: $e^{i\gamma E(x,y,z)\tau} \cdot e^{i\gamma E(x,y,z)t}$ in order to take account of the phases acquired by the different magnetization vectors, due to the inhomogeneity of the field, during the phase and frequency coding periods respectively. The first of these two exponential functions is a constant which is maintained in state after phase coding and the second is unfortunately both a function of x,y,z and of time t. When using Fourier transforms, it leads to stigmatic distortions, which are made worse by an interference of the information of the real and imaginary images mixing the absorption and dispersion terms and making these errors uncorrectable if the function $E(x,y,z)$ and the chart or map of the field are not known beforehand. During the reconstruction of the image by the computer, these errors lead to an erroneous spatial allocation of the magnetization intensity of each elementary volume constituting the sample. These stigmatic distortions lead to serious deformations of the image and are particularly prejudicial when microimaging is performed and it is wished to represent very fine details.

Moreover, the inhomogeneity of the NMR field also prejudices the sensitivity of the measurements (signal to noise ratio). Thus, if the inhomogeneity of B leads to a dispersion $\Delta B$ on the volume of the sample, the spatial resolution limit is approximately $\Delta B/G$ in the presence of a gradiant G. As the resolution limit is fixed and the sample size predetermined, the spectral interval over which the resonance signals are spread increases with the size of $\Delta B$. This causes a reduction in the signal energy per spectral interval and working in the inhomogeneous field is poor for the sensitivity.

Obviously attempts have been made to obtain perfected magnets, whose field is homogeneous to within a high degree of precision. However, the obtaining of $\Delta B/B$ of approximately $10^{-6}$ or better on volumes close to 10 liters, requires an excellent alignment of the elements and/or coils producing the magnetic field. For these technical reasons, the cost of high resolution magnets is very high (e.g. a cryomagnet giving a field of 2.3 Tesla with an inhomogeneity of $10^{-6}$ in a 30 cm diameter sphere costs approximately 1.5 MF). The imaging of the proton (water $\sim 80\%$ of the body) causes no sensitivity problems, because the proton signals are very intense and numerous. Thus, an imaging method in the heterogeneous field ($\Delta B/B \simeq 10^{-4}$), overcoming distortions due to the non-uniformity of the magnetization polarization field can be envisaged in the case of the proton (essentially medical displays), without any significant sensitivity loss. This would lead to considerable economies regarding the cost of the magnets and consequently the overall costs of the equipment.

For information purposes, reference is made to the methods consisting of previously drawing up the chart or map $E(x,y,z)$ of the field and entering the values measured in the computer which builds up the image or picture. It is obvious that these methods are not very satisfactory, because they take a long time and are difficult to use and therefore very expensive.

SUMMARY OF THE INVENTION

The present invention relates to a process for the generation and processing of signals for obtaining by NMR a distortion-free image from a heterogeneous polarization field making it possible, with the aid of simply doubling the number of measurements performed, to completely overcome the inhomogeneities of the polarization field, including those introduced by the presence of the body to be imaged and which also supplies as a by-product, the cartography of the polarization magnet field.

This process, which uses the known methods of coding the image in two or three dimensions (2D,FT and 3D,FT) involving the application of a 90° radiofrequency pulse in the xOy plane, then phase coding for a time $\tau$ followed by frequency coding by applying along Ox a reading gradient during the acquisition of the free precession signal, which then undergoes Fourier transformations relative to time and relative to the gradient or gradients applied and which is collected in complex form, wherein the following stages are involved:

(a) during a first series of signal acquisition sequences involving phase coding and frequency coding, the complex signals $s_1(\tau,t)$ are collected in the known manner;

(b) during a second series of sequences involving the successive application of the same gradients, the free precession system is subject to a second 180° radiofrequency pulse at the start of establishing each reading gradient, so as to change to $-\phi$ (or $\pi - \phi$ as a function of the particular case) the $\phi$ phases acquired by the different magnetic moments during phase coding and the n imaginary signals $s_2(\tau,t)$ are collected, stages (a) and (b) being either successive or interleaved in time;

(c) the conjugate signals $s^*_2(\tau,t)$ of $s_2(\tau,t)$ are formed, which are such that $s^*_2(\tau,t) = s_1(\tau,-t)$, and they are associated one by one with their homolog $s_1(\tau,t)$ so as to form n complex signals $s(\tau,t)$ in which t varies from $-T$ to $+T$, T being the acquisition time of each signal counted from the start of applying the reading gradient;

(d) the Fourier transforms with respect to time t and with respect to the gradient or gradients applied are performed on these signals $s(\tau,t)$ for which $-T < t < +T$, which supplies a multidimensional complex image, whose real and imaginary parts R, I respectively only have pure absorption terms;

(e) on each point x,y,z are performed distortion corrections along Ox and magnetization intensities are allocated by successively calculating the correct value of the phase $$\phi = \text{Arc cos} \frac{R}{\sqrt{R^2 + I^2}}$$

the function E(x,y,z) representing the cartography of the field by the relation $\phi(x,y,z) = \gamma E(x,y,z)\tau$, then by the relation $Gx \cdot x + E(x,y,z) - Gx \cdot x' = 0$, the value x' of x to which is to be allocated the magnetization intensity found.

Through doubling the number of measurements performed with respect to known methods and on preceding on every other occasion the establishment of the reading gradient Gx by a 180° pulse consequently makes it possible to define a resonance signal which evolves in time from $-T$ to $+T$ and to obtain, after the two Fourier transforms, an image which, although distorted in the direction of the reading gradients is free from interference, i.e. whereof the real and imaginary parts R, I in the direction of said same reading gradient only have pure absorption terms. This makes it possible to subsequently correct the distortion, by a calculation at each point of the exact phase of the inhomogeneity E(x,y,z) of the field and then the exact value x' of the ordinate x to which is to be attributed the magnetization intensity found at point (x,y,z).

During the following explanations, for reasons of simplicity, reference will be made to two-dimensional imaging (x,y) with a section selection along Oz. However, it must be understood that this in no way limits the application field of the invention and that the generalization in the case of three-dimensional imaging falls within the routine activity of the expert. Moreover, the particular choice made throughout the present text of the particular functions of the three coordinates x,y and z with respect to the polarization field and the directions of the gradients applied results from standard international practice in this field, but in no way limits the scope of the present invention.

BRIEF DESCRIPTION OF THE DRAWINGS

In specific, FIGS. 1–3 are scheme allowing a better understanding of general NMR theory;

FIGS. 4–5 in specific describe respectively, the sequences of the conventional three-dimensional direct Fourier method and of the two-dimensional direct Fourier method.

Figure 6:
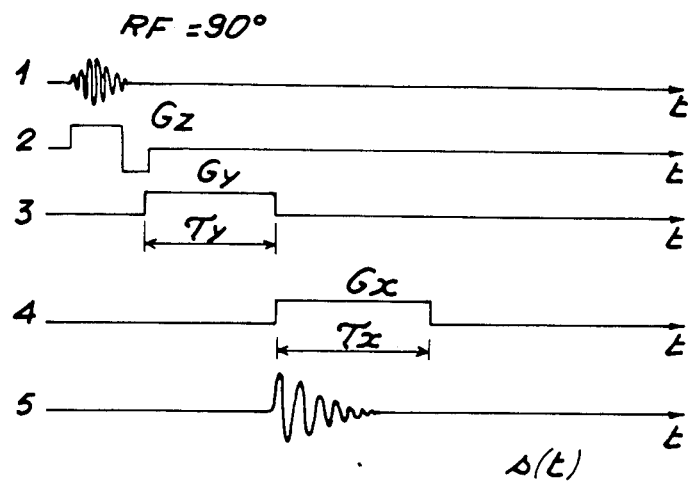
Figure 7:
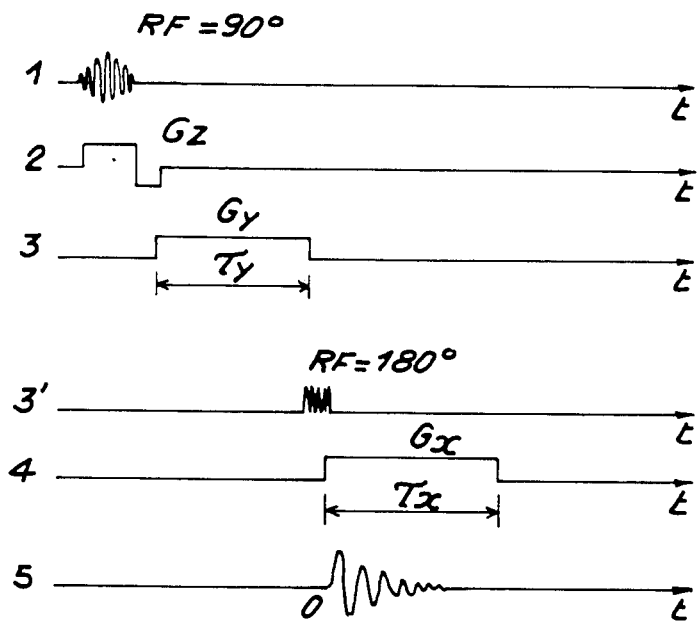

A mathematical explanation will now be given of the effectiveness of the process according to the invention, with reference to FIGS. 6 to 16, wherein show:

FIGS. 6 and 7—The two sequences necessary within the scope of the invention for building up a NMR image by the 2D, FT process with section selection perpendicular to Oz.

Figure 6A:
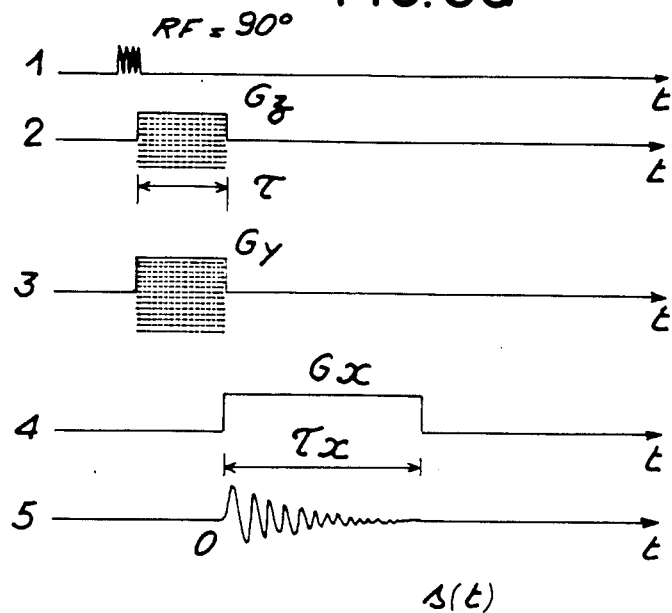
Figure 7A:
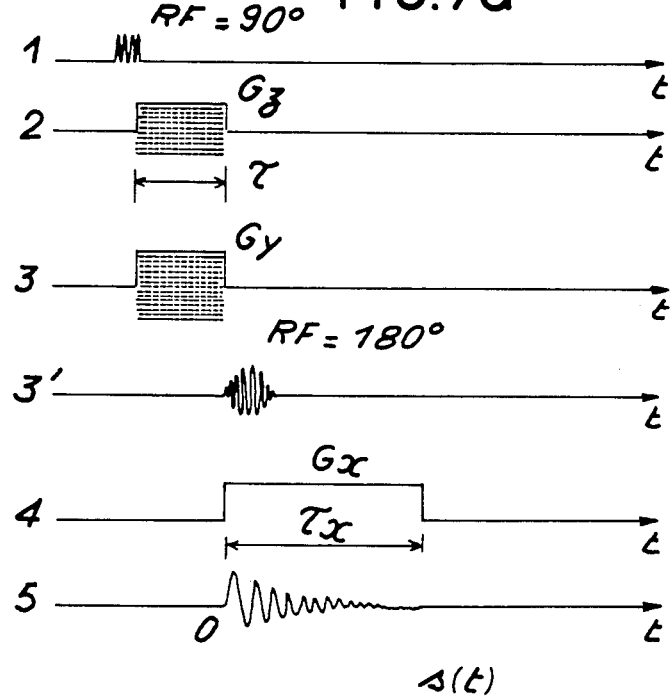

FIGS. 6a and 7a—The two sequences necessary within the scope of the invention for the building up of a NMR image by the 3D,FT process.

Figure 8:
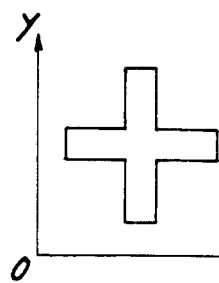
Figure 9:
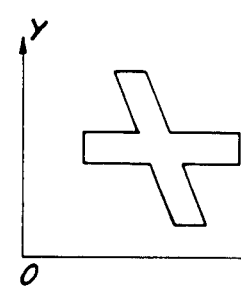
Figure 10:
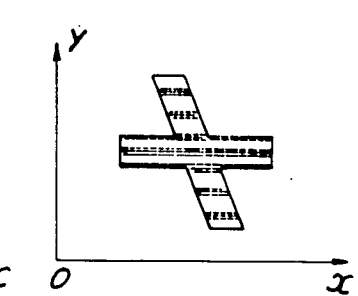

FIGS. 8, 9, and 10—The shape and intensity distortions of a two-dimensional image due to the inhomogeneity of the polarization field Bo, which can be corrected by means of the invention.

FIGS. 11 to 16—The absorption and dispersion terms of the complex spectrum of the image obtained by Fourier transform in the different hypotheses envisaged.

DETAILED DESCRIPTION OF THE INVENTION

In order to take account of the inhomogeneity of the polarization field, the value thereof will be written in the form $B(x,y) = Bo + E(x,y)$, E(x,y) representing the homogeneity defect or map of the field at point (x,y). In this hypothesis, during the first series of acquisition sequences of signals without 180° pulse (FIG. 6), the following signals are collected:

$$s_1(t, \tau y) = \int\int_{xy} M(x,y) e^{i\gamma Gy \cdot y \cdot \tau y} \cdot e^{i\gamma E(x,y)\tau y} \cdot e^{i\gamma Gx \cdot x \cdot t} \cdot e^{i\gamma E(x,y)t} \, dx \cdot dy$$

in which no account is taken of the attenuation $e^{-t/T_2}$ and the ripple $e^{i\omega_0 t}$ of the signal, which is possible in connection with the latter element because a synchronous detection is performed.

In this formula, the two first exponential functions represent the phases acquired by each magnetization vector $\vec{M}(x,y)$ during phase coding and due respectively to the application of the gradient Gy and to the homogeneity defect of the field E(x,y). For a given value of y, these phases are constants. The two latter exponential functions represent the phases acquired by these same vectors $\vec{M}(x,y)$ during the reading time t and due respectively to the application of the gradient Gx and to the homogeneity defect of the field E(x,y). These phases are dependent on time t and for the latter $i\gamma E(x,y)t$, both of x and y. It is precisely the latter term which, due to its double dependence of x and y, would be very prejudicial and would "obscure" the image in an irreparable manner if the matter was left there.

Figure 1:
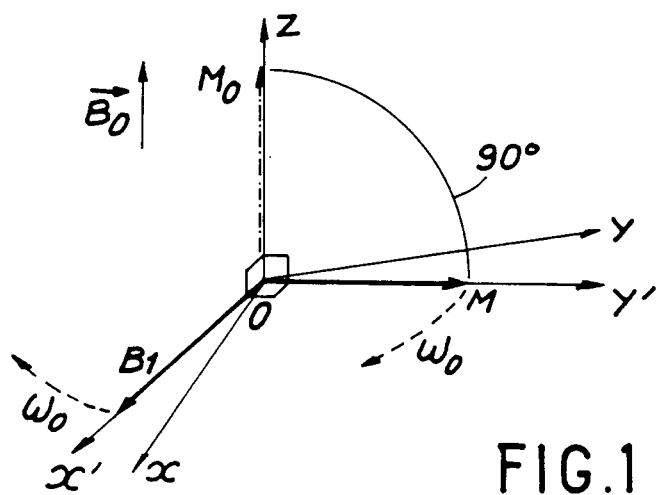
FIGS. 1–5 illustrate the known art of NMR imaging.
Figure 2:
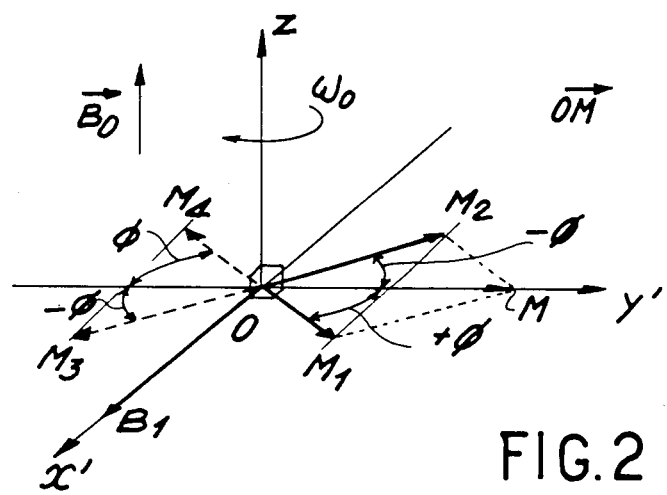
Figure 3:
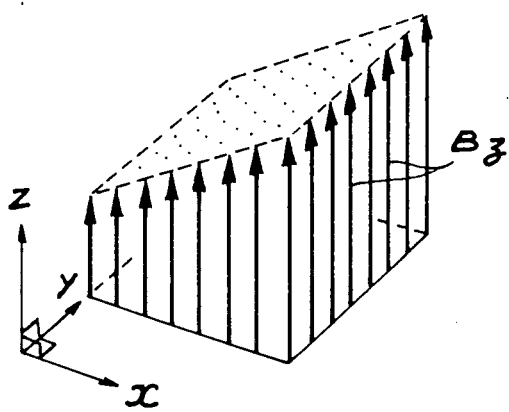
Figure 4:
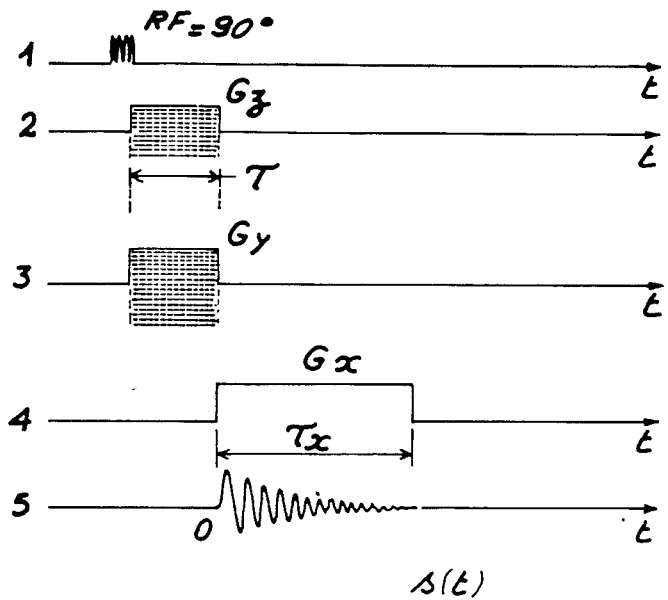
Figure 5:
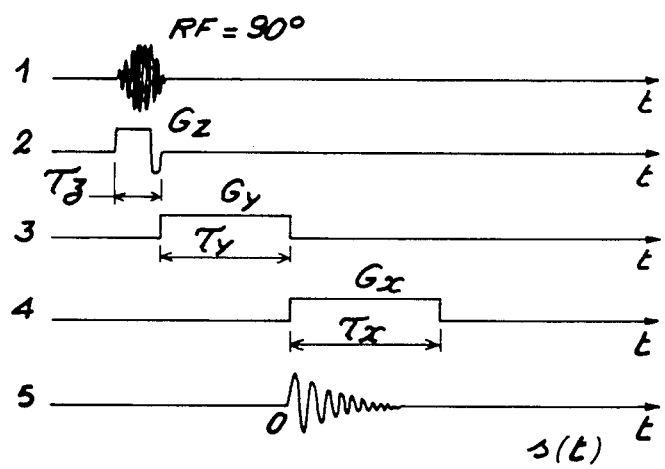

During the second series of signal acquisition sequences shown in FIG. 7, the application of each reading gradient Gx is preceded by a second 180° radiofrequency pulse at frequency $\omega_0$, whereby in this part of the demonstration, it will be assumed that this pulse is in quadrature with the first, i.e. along axis Oy' of FIG. 2. Thus, according to the explanations given in the introduction to the present text, a change of sign of phases $\phi$ acquired by each magnetization vector $\vec{M}(x,y)$ during phase coding and the signals $s_2(\tau y, t)$ collected have the general form:

$$s_2(t, \tau y) = \int\int_{xy} M(x,y) e^{-i\gamma Gy \cdot y \cdot \tau y} e^{-i\gamma E(x,y)\tau y} \cdot e^{i\gamma Gx \cdot x \cdot t} \cdot e^{i\gamma E(x,y)t} \, dxdy$$

If the conjugate imaginary signals are now formed $s_2^*(t,\tau y)$, they are written in the general form:

$$s_2^*(t, \tau y) = \int\int_{xy} M(x,y) e^{i\gamma Gy \cdot y \cdot \tau y} \cdot e^{i\gamma E(x,y)\tau y} \cdot e^{-i\gamma Gx \cdot x \cdot t} \cdot e^{-i\gamma E(x,y)t} \, dxdy$$

and it is easy to see the equation:

$$s_2^*(t,\tau y) = s_1(-t,\tau y)$$

This is the essential characteristic of the process according to the invention which makes it possible, by associating in pairs the 2n total signals received from 0 to +T to define n signals s(t,$\tau_y$) in which t varies from −T to +T. For this purpose, it is merely necessary to associate each signal s$_1$(t,$\tau_y$) of the first sequence with its homolog s$_2$*(t,$\tau_y$) of the second sequence obtained after applying a 180° pulse and conjugation of the signal.

It is this possibility of integrating the signals − ∞ top + ∞ during the Fourier transforms or more accurately −T to T, because infinity does not exist for the physicist, which makes it possible, although the signals are in actual fact read from 0 to T, to eliminate the interference of the image, whose components now only contain pure absorption terms as a result of the process according to the invention. This result is based on a known mathematical theorem, according to which:

$$\int_0^{+\infty} e^{-i\lambda x} dx = A(\lambda) + iB(\lambda), \lambda \text{ random parameter,}$$

whereas $$\int_{-\infty}^{+\infty} e^{-i\lambda x} dx = A(\lambda), A \text{ and } B \text{ function of } \lambda, \text{ i.e.}$$

the integration of −∞ to +∞ makes it possible to eliminate the imaginary part of the result of the integration. This property will be demonstrated hereinafter in a particular case.

The forementioned signal s$_1$(t,$\tau_y$) can also be written S$_1$(G$_y$,t) because in actual fact, it is during each measurement G$_y$ that there is a variation during the same time $\tau_y$ from −G to +G. Under these conditions, the double Fourier transform with respect to Gy and t is written:

$$A(yo, Gx \cdot x') = \int\int_{-\infty}^{+\infty} s(Gy,t)e^{-i\gamma Gy \cdot yo \cdot \tau} \cdot e^{i\gamma Gx \cdot x' t} dGy \cdot dt$$

The first Fourier transform with respect to Gy is equal to:

$$1/\tau \int_{-\infty}^{+\infty} M(x,yo)e^{i\gamma E(x,yo)\tau} \cdot e^{i\gamma \{Gx \cdot x + E(x,yo) - Gx \cdot x'\}t} \cdot dx$$

formula in which x' is the corrected abscissa of the distortion to which it is necessary to attribute the intensity found for point x,y.

The second Fourier transform with respect to t is equal to:

$$A(yo, Gx \cdot x') = \frac{1}{\tau \cdot \xi} \cdot M(xo,yo)e^{i\gamma E(xo,yo)\tau} \quad (1)$$

which finally gives the two tables of points (x,y) having their intensity M(x,y) constituting what is known as the "real" and "imaginary" parts of the complex image and in which xo and $\xi$ are given by the equations:

$$Gx \cdot xo + E(xo,yo) - Gx \cdot x' = 0 \quad (2)$$

and $$\xi = \frac{\partial}{\partial x}[Gx \cdot x + E(x,yo) - Gx \cdot x']_{x=xo} \quad (3)$$

The pairs of values M,x and y given by the equation (1) are subject to a systematic error due to the inhomogeneity E(x,y) which leads to a distortion of the image in direction x of the reading gradient. In other words, for correcting this image distortion, it is still necessary to seek, for a given value of y, the exact value x' of x to which it is necessary to attribute the magnetization intensity M and this is realized in the following way.

The comparison of the real and imaginary parts R, I respectively of equation (1) makes it possible to calculate the phase $\phi$ of the signal at point x,y, e.g. formula:

$$\phi = \text{Arc cos} \frac{R}{\sqrt{R^2 + I^2}}$$

and the value of E(xo,yo). This value, reported in (2), makes it possible to deduce xo because Gx and Gx·x' are known. Finally, the knowledge of E(xo,yo) for any value of x makes it possible to calculate $\xi$. Thus, finally a determination of M(x,y) is obtained and this gives E(x,y) or the cartography of the field in the form of a by-product of the method.

Thus, it is the possibility of carrying out Fourier transforms on a signal varying from −T to +T which makes it possible, according to the process of the invention, to construct an image free from its distortions by calculating the exact phase at each point and the exact abscissa x' for each measured intensity M(x,y). Moreover, the fact that the process leads to the obtaining, as a by-product, of the exact cartography of the field E(x,y) is also one of the major advantages of the invention.

The extension of the above to three-dimensional imaging causes no basic problem.

Thus, the sequences necessary for such 3D,FT NMR imaging applying the process of the invention are diagrammatically shown in FIGS. 6a (90° pulse only) and 7a (90°and 180° pulses), which can be understood by comparison with FIGS. 6 and 7. Specifically, during the first sequence according to this invention, there is only one 90° radiofrequency pulse similar to that in the prior art as shown in FIGS. 6 and 6a. During the second sequence according to this invention, there are two radiofrequency pulses, namely, a first 90° radiofrequency pulse and a second 180° radiofrequency pulse (see FIGS. 7 and 7a). The "second 180° radiofrequency pulse" means, the second series of the sequence, a second radiofrequency pulse, which is in fact a 180° pulse is provided. Consequently, the complete sequence of the process according to this invention comprises three radiofrequency pulses, to wit a first one of 90°; a second one of 90°; and a third one of 180°. It can be seen that graphs 2 and 3 correspond to phase codings along Oy and Oz, graphs 4 to frequency coding along Ox and in which the radiofrequency pulses (graphs 1 and 3') and reading pulses (graph 5) are obtained as in the example of FIGS. 6 and 7.

According to the invention, the signals obtained with the aid of the two sequences of FIGS. 6a and 7a are associated, as explained relative to FIGS. 6 and 7, so as to define a signal in the intervals $[-T, +T]$, $[-G_z, +G_z]$ and $[-G_y, +G_y]$.

The mathematical analysis of this process is then as follows: $\Delta(x,y,z) = \gamma E(x,y,z)$ the variation of the ripple at point (x,y,z) with respect to the nominal value of the ripple; $\Delta(x,y,z)$ consequently measures the inhomogeneity in (x,y,z).

The collected signal is of form:

$$s(G_y, G_z, t) = \iiint_{xyz} dx\, dy\, dz\, M(x,y,z) e^{i\Delta(x,y,z)\tau}$$

$$e^{i\gamma G_y y\tau} e^{i\gamma G_z z\tau} e^{i\gamma G_x xt} e^{i\Delta(x,y,z)t}$$

The three Fourier transformations are carried out with respect to $G_y$, $G_z$ and t in a random order.
For a signal S, this Fourier transformations are:

with respect to $G_y$
$$\frac{1}{2\pi} \int_{-G_y}^{+G_y} S\, e^{-i\gamma G_y y_0 \tau}\, dG_y$$

with respect to $G_z$
$$\frac{1}{2\pi} \int_{-G_z}^{G_z} S\, e^{-i\gamma G_z z_0 \tau}\, dG_z$$

with respect to $t$
$$\frac{1}{2\pi} \int_{-T}^{+T} S\, e^{-ikt}\, dt$$

hence the result
$$S(z_0, y_0, k) = \frac{1}{(2\pi)^3} \frac{1}{\gamma^2 \tau^2 \xi} M(x_0, y_0, z_0) e^{i\Delta(x_0, y_0, z_0)\tau}$$

in which $x_o$ and $\xi$ are given by the equation:

$$\gamma G_x x_o + \Delta(x_o, y_o, z_o) - K = 0$$

$$\xi = \left| \frac{\partial}{\partial x} (\gamma G_x x + \Delta(x, y_o, z_o) - K) \right|_{x=x0} = 0.$$

In this case, the result of the Fourier transforms is a three-dimensional complex image with a "real" volume and an "imaginary" volume, which are free from dispersion terms, i.e. at the computer output there are two series of groups of four discrete values M,x,y,z corresponding to the different points of these two volumes. For each of the points of these two volumes, the values z and y are correct, but those of M and x are erroneous due to the distortion resulting from the inhomogeneity E(x,y,z) of the field. As in the case of bi-dimensional imaging, these image distortion errors are corrected by successively calculating for each point: the correct phase $$\phi = \text{Arc cos} \frac{R}{\sqrt{R^2 + I^2}}$$

R and I being respectively the real and imaginary parts of the complex image in direction x;
the function E(x,y,z) by the relation;
$\phi(x,y,z) = \gamma E(x,y,z)\tau$;
the value x' and y to which must be allocated the intensity M(x,y,z) found for the point in question by the relation:

$$G_x \cdot x + E(x,y,z) - G_x \cdot x' = 0.$$

It is useful at the present stage of the description to make the following comments.

Firstly, the above calculation assumes that the general equation $G_x \cdot x + E(x,y,z) - G_x \cdot x' = 0$ only has a single solution. This can be fortunately realized without difficulty if Gx is sufficiently large for $G_x \cdot x + E(x,y,z)$ to be a monotonic function, which is in practice always achieved.

The above calculations are in fact carried out on discrete samples of the investigated functions, because all the signals are digitized for computer processing and the collected complex analytical signal which, as is always the case in NMR, results from a detection in quadrature (real or cosine part and imaginary or sine part) in fact is broken down into a double list of groups of discrete points. This is not an obstacle to the practical performance of the calculations described hereinbefore.

Finally, according to a variant of the process according to the invention, the second 180° radiofrequency pulse is in phase with the first applied at the start of phase coding and signals $s_2^*(\tau,t) = -s_1(\tau,-t)$ and these undergo a sign change before associating same with their homolog of the first sequence.

Thus, if the second 180° radiofrequency pulse is applied along Ox' in phase with the first 90° pulse, the phases acquired during phase coding instantaneously change to $(\pi T - \phi)$, as explained relative to FIG. 2. Thus, the exponential functions of the expression $s_1(t,\tau)$ relating to the phase $\phi$ acquired during phase coding are converted from $e^{i\phi}$ into $e^{i(\pi-\phi)} = -e^{-\phi}$. Thus, in this case $s_2^*(\tau,t) = -s_1(\tau,t)$.

It is therefore necessary in this case to change the sign of the signals $s_2^*(\tau,t)$ before associating them with their homolog of the first sequence for calculating the Fourier integrals from $-T$ to $+T$.

As complementary information on the process of the invention, a certain number of explanations and justifications will now be given regarding the performance of the present process which, in the particular case of a two-dimensional image, will provide a better understanding of the theoretical data given hereinbefore.

For the complex image calculated by the computer, the inhomogeneity of the polarization field Bo, for both the real and imaginary parts, leads to two types of distortion:

(a) shape distortion (e.g. the vertical arm of the straight cross in FIG. 8 is inclined FIG. 9, because shape distortions occur in directions Oy perpendicular to those Ox of the reading gradient Gx, which is horizontal);

(b) intensity distortion (e.g. a region whose grey level is normally uniform is then striped with alternatively more intense or darker bands in directions perpendicular to the magnetic field equipotentials, which are in this case horizontal (FIG. 10) (case of a residual gradient along Oy for E(x,y)).

The imaginary image has identical distortions of types (a) and (b).

However, the major difference between the process according to the invention and the prior art is that these distortions take place without interference to the information. These are distortions without astigmatism whereas in the conventional procedure they are astigmatic, i.e. real abbreviations which cannot be corrected (except through knowing beforehand the cartography of the field and account is taken thereof in the image build-up process). The following statements make it possible to understand why this is the case.

To understand this, it is necessary to refer to the particular properties of the Fourier transformation, which takes place on signals whose amplitude decreases with the value of the acquisition parameter.

In imaging by 2D,FT, there are two acquisition parameters:
- time (s≃o si |t|>Tm, Tm of the order of T, due to the transverse relaxation;
- gradient Gy, if Gy is high the phase displacement of the nuclear spins is very fast and the collected signal small (s≃o si |Gy|>Gm, Gm of the order of G maximum absolute value of the coding gradient used $-G \leq Gy \leq +G$);

Gy still occupies a range having positive and negative values, which are generally opposite to one another and which all correspond to what is called sampling of the value of the gradient.

In order to simplify the analysis, consideration will be given to the dependence of a signal relative to time (relative to Gy the problem is the same, so that a single "reasoning" will be sufficient). For further simplification, consideration will be given to a "monochromatic" signal, which removes nothing of the general nature of the reasoning because the signal received can be looked upon as the superimposing (addition) of monochromatic signals.

Thus, the reasoning will relate to a signal:

$$s(t) = a\, e^{-t/T_2}\, e^{j\omega o t},\ j = \sqrt{-1}$$

$T_2$ characterizing the transverse attenuation of the signal (in NMR it is called the apparent spin — spin relaxation time and it governs the value of the width of the line).

The Fourier transform of s(t)(or complex spectrum) is defined as follows:

$$S(\omega) = \int_{-\infty}^{+\infty} s(t)\, e^{-j\omega t}\, dt$$

If the signal is defined from 0 to ∞ s(t)=0 if t<0, we obtain:

$$S(\omega) = \int_{-\infty}^{0} 0 + \int_{0}^{\infty} s(t)\, e^{-j\omega t}\, dt$$

$$S(\omega) = \int_{0}^{\infty} a\, e^{(-1/T_2 + j(\omega o - \omega))t}\, dt$$

$$S(\omega) = a\, \frac{1}{-1/T_2 + j(\omega o - \omega)}\ [0-1]$$

$$S(\omega) = a\, \frac{-1(-1/T_2 - j(\omega o - \omega))}{(1/T_2)^2 + (\omega o - \omega)^2}$$

$$S(\omega) = a\, \frac{T_2}{1 + (\omega o - \omega)^2 T_2^2} + ja\, \frac{T_2^2(\omega o - \omega)}{1 + (\omega o - \omega)^2 T_2^2}$$

$$S(\omega) = Ro(\omega) + jIo(\omega)$$

Figure 11:
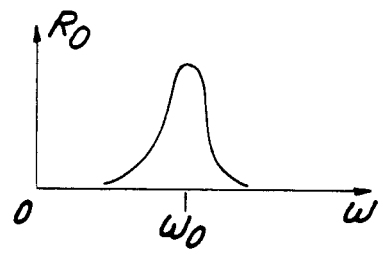

The spectrum is complex.
The real part $$Ro = \frac{aT_2}{1 + (\omega o - \omega)^2 T_2^2}$$

represents the absorption term (usual notation in spectroscopy) shown in FIG. 11.

Figure 12:
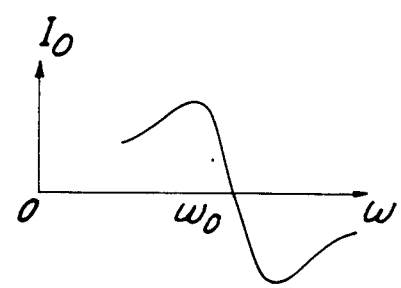

The imaginary part represents the dispersion term:

$$iO = \frac{aT_2^2(\omega o - \omega)}{1 + (\omega o - \omega)^2 T^2}$$

represented in FIG. 12.

If the signal is defined $-\infty$ to $+\infty$, it is possible to write:

$$S(\omega) = a\int_{-\infty}^{+\infty} e^{(-1/T_2 + j(\omega o - \omega))t}\, dt,\ \text{but this is incorrect,}$$

but this is incorrect, because account mut be taken of the fact that if t→−∞ s(t)→0.

This leads to the following equations:

$$S(\omega) = a\left\{ \int_{-\infty}^{0} e^{-|t|/T_2} e^{j(\omega o - \omega)t}\, dt + \int_{0}^{\infty} e^{(-1/T_2 + j(\omega o - \omega))t}\, dt \right\}$$

$$S(\omega) = a\left\{ -\int_{0}^{-\infty} e^{-|t|/T_2} e^{j(\omega o - \omega)t}\, dt + \int_{0}^{\infty} e^{(-1/T_2 + j(\omega o - \omega))t}\, dt \right\}$$

$$S(\omega) = a\left\{ -\int_{0}^{\infty} e^{-t/T_2} e^{-j(\omega o - \omega)t}\, (-dt) + \int_{0}^{\infty} e^{(-1/T_2 + j(\omega o - \omega))t}\, dt \right\}$$

$$= a\left\{ \frac{(0-1)}{-1/T_2 - j(\omega o - \omega)} + \frac{(0-1)}{-1/T_2 + j(\omega o - \omega)} \right\}$$

$$S(\omega) = 2a\, \frac{T_2}{1 + (\omega o - \omega)^2 T_2^2}$$

The spectrum is real and only has a single term, which is an absorption term equal to $2Ro(\omega)$. In the case of a heterogeneous field, it is necessary to consider a signal having a supplementary argument $\phi$ so that:

$s'(t)=s(t)e^{j\phi}$, $e^{j\phi}$ being a constant for each spin.

In this case, said supplementary phase $\phi$ is what is introduced by the inhomogeneity of the field. Thus, if all the nuclei do not see the same field B, they precess at different angular velocities from those imposed thereon by the phase coding Gy and the frequency coding Gx during reading.

Thus, in the ideal case $\phi$ is zero (no inhomogeneities), whereas in the non-ideal case $\phi$ is a function of the spatial position of the spins.

The Fourier transformation gives $S'(\omega)=S(\omega)e^{j\phi}$ instead of $S(\omega)$ studied hereinbefore.

($\alpha$) if the signal is only defined from 0 to $+\infty$ $$e^{j\phi}=\cos\phi+j\sin\phi$$

and $$S'(\omega) = (Ro(\omega) + j\,Io(\omega))(\cos\phi + j\sin\phi)$$
$$= Ro(\omega)\cos\phi - Io(\omega)\sin\phi + j[Ro(\omega)\sin\phi + Io(\omega)\cos\phi]$$

Figure 13:
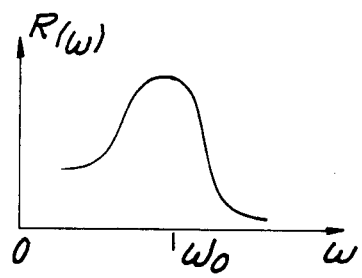
Figure 14:
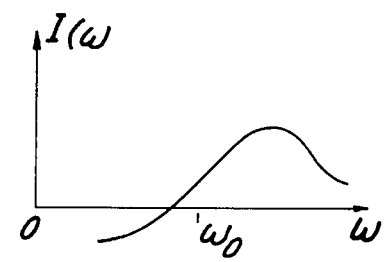

It is pointed out that the real and imaginary parts are linear combinations of the absorption and dispersion terms shown in FIGS. 13 and 14 in which:

$$R(\omega)=Ro(\omega)\cos\phi-Io(\omega)\sin\phi$$

and $$I(\omega)=Ro(\omega)\sin\phi+Io(\omega)\cos\phi.$$

The spectrum is consequently obscured by the presence of these mixtures and as a result there is a considerable resolution loss, i.e. an irreparable interference with these images.

Figure 15:
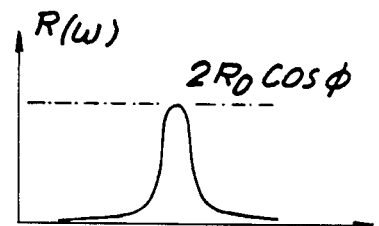
Figure 16:
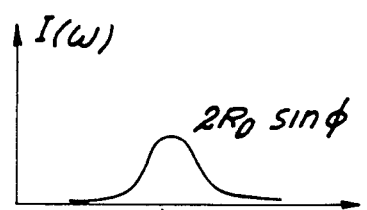

($\beta$) if the signal if defined from $-\infty$ to $+\infty$ $$S'(\omega)=2Ro\cos\phi+j2Ro\sin\phi$$

i.e. the imaginary part $I=2Ro\sin\phi$ and real part $R=2Ro\cos\phi$ are pure absorption terms modulated by $\cos\phi$ and $\sin\phi$ (cf. FIGS. 15 and 16).

Thus, there is no need for the value of $\phi$ to be known to enable a phase correction to be carried out, because knowing R and I, it is possible to deduce from:

$$\phi = \arccos\frac{R}{\sqrt{R^2+I^2}}$$

which, in the process according to the invention, amounts to determining the inhomogeneity of B at each point.

These mathematical results are immediately applicable to the process of obtaining correct NMR images in the inhomogeneous field.

The phase variation $\phi(x,y)$ which will be corrected appears during the period of phase coding by gradient Gy and is written:

$$\phi(x,y)=\gamma E(x,y)\tau$$

in which E(x,y) is the "error" on B at point x,y and $\tau$ the duration of application of gradient Gy.

Moreover, during the reading period (0-t), there is a frequency slide $\gamma E(x,y)2\pi$ which is unfortunately dependent on both x and y for the point (x,y) compared with the value observable in the perfectly uniform field. The generalized phase acquired during Gx due to the inhomogeneity E(x,y) is $\gamma E(x,y)t$ and at each instant, consequently introduces:

(i) if acquisition takes place from 0 to $\infty$, a mixture of absorption terms and dispersion terms, which is irreparable on not knowing E(x,y) beforehand and this applies in the real and imaginary parts of the Fourier transforms with respect to time.

(ii) if acquisition takes place from $-\infty$ to $+\infty$, a real part and an imaginary part free from dispersion terms and this makes it possible to determine the variation compared with the nominal value of B at any point x,y. However, the frequency slide persists, so that the images are deformed in direction ox of the reading gradient. It is also necessary to operate in two stages for carrying out the correction.

First of all the image is constructed, whilst retaining the two informations: real and imaginary. Thus, one has the real image and the imaginary image. Only the direction x is affected by shape distortions on each image.

(1) On marking a point (x,y) on said complex image, at this point the comparison of the values supplied by the real image (R) and the imaginary image (I) gives: E(x,y) by the relation:

$$\gamma E(x,y)\tau = \arccos\frac{R}{\sqrt{R^2+I^2}}$$

and the intensity at this point is $$\sqrt{R^2+I^2} = Ro$$

(2) Position y is correct, but not position x, which is x', so that:

$$G_x x + E(x,y) - G_x x' = 0$$

in which x' is the value of the abscissa at which intensity Ro is to be allocated. This intensity is consequently definitively allocated to the pair (x',y) and the correct form of the image, with its correct image signal is restored.

To complete the description of the invention and its main applications, a few complementary explanations or remarks will now be given.

(a) The process according to the invention requires an exposure time which is twice that required by ordinary imaging. This could be looked upon as a disadvantage, but is relatively minor when compared with the great advance made in connection with the image quality.

(b) The value of the error E(x,y,z) or inhomogeneity is determined by the restoration method and not by prior cartography. This is a "by-product" of the process and can be useful if it is wished to determine the inhomogeneity introduced by the presence of the sample. For example, in microscopic NMR imaging (objects smaller than 1 mm) it is consequently possible to observe (whilst removing the same) the deformations of the line of the magnetic field caused by the distribution of the regions, whose diamagnetic susceptibilities are different. From this is deduced an imaging method of the distribution of the diamagnetic susceptibilities. Moreover, the process according to the invention makes it unnecessary to have recourse to very large gradient values in microscopic methods, such values at present being necessary in order to attenuate the heterogeneity of the objects observed.

(c) A minor inconvenience persists, the fact that the phase displacement is defined to within $2\pi$, the knowledge of E takes place modulo Eo, so that $\gamma E o \tau = 2\pi$. However, by continuity, it is virtually always possible to determine the correct value of E.

(d) It is also possible to operate in the presence of non-constant gradients, provided that the spatial variation of the field imposed by the gradient is monotonic (i.e. if it produces no splitting of the field value during use). Thus, the application of a non-constant gradient amounts to superimposing a supplementary inhomogeneity $E'(x,y)$. However, the correct determination of $E(x,y)$ from the value obtained $Eo(x,y) = E(x,y) + E'(x,y)$ imposes the knowledge of $E'(x,y)$.

(e) The process is also applicable to any imaging operation performed in a field considered as uniform by the designers.

As $\Delta B/Bo$ is given by the designer, the spatial resolution limit in the image can be considered as equal to $\Delta l = \Delta B/G$, in which G is the absolute value of the reading gradient used (Gx). It would therefore appear possible to move back the spatial resolution limit presently obtainable in the image plane to a much lower value without using significantly higher gradient values than those used at present. Thus, there is a significant improvement to the way in which said gradients are applied, smaller current supplies and reduced electrical consumption.

Finally, the process according to the invention is applicable to numerous NMR imaging types, namely 2D,FT and 3D,FT imaging, microscopic imaging, as well as saturation-recovery, inversion-recovery and spin echo sequences, as well as the sequences specific to the study of liquid movements and sequences affecting water/fat contrast in the imaging of protons on biological samples.

What is claimed is:

1. A process for the generation and processing of signals for obtaining a nuclear magnetic resonance image, which is free from distortions on the basis of an inhomogeneous polarization field $B = Bo + E(x,y,z)$, using the known methods of coding the image in two or three dimensions (2D,FT and 3D,FT) involving the application of a 90° radiofrequency pulse in the xOy plane, then phase coding for a time $\tau$ followed by frequency coding by applying along Ox a reading gradient during the acquisition of the free precession signal, which then undergoes Fourier transformations relative to time and relative to the gradient or gradients applied and which is collected in complex form, wherein the following stages are involved:

(a) during a first series of signal acquisition sequences involving phase coding and frequency coding, the complex signals $s_1(\tau,t)$ are collected in the known manner;

(b) during a second series of sequences involving the successive application of the same gradients, the free precession system is subject to a second 180° radiofrequency pulse at the start of establishing each reading gradient, so as to change to $-\phi$ (or $\pi - \phi$ as a function of the particular case) the $\phi$ phases acquired by the different magnetic moments during phase coding and the n imaginary signals $s_2(\tau,t)$ are collected, stages (a) and (b) being either successive or interleaved in time;

(c) the conjugate signals $s_2^*(\tau,t)$ of $s_2(\tau,t)$ are formed, which are such that $s_2^*(\tau,t) = s_1(\tau,-t)$, and they are associated one by one with their homolog $s_1(\tau,t)$ so as to form n complex signals $s(\tau,t)$ in which t varies from $-T$ to $+T$, T being the acquisition time of each signal counted from the start of applying the reading gradient;

(d) the Fourier transforms with respect to time t and with respect to the gradient or gradients applied are performed on these signals $s(\tau,t)$ for which $-T < t < +T$, which supplies a multidimensional complex image, whose real and imaginary parts R, I respectively only have pure absorption terms;

(e) on each point x,y,z are performed distortion corrections along Ox and magnetization intensities are allocated by successively calculating the correct value of the phase $$\phi = \text{Arc cos} \frac{R}{\sqrt{R^2 + I^2}}$$

the function $E(x,y,z)$ representing the cartography of the field by the relation $\phi(x,y,z) = \gamma E(x,y,z)\tau$, then by the relation $Gx \cdot x + E(x,y,z) - Gx \cdot x' = 0$, the value $x'$ of x to which is to be allocated the magnetization intensity found.

2. A process for obtaining and processing signals according to claim 1, wherein the second 180° radiofrequency pulse is in quadrature with the first pulse applied at the start of phase coding and the following signals are obtained: $s_2^*(\tau,t) = s_1(\tau,-t)$.

3. A process for obtaining and processing signals according to claim 1, wherein the second 180° radiofrequency pulse is in phase with the first pulse applied at the start of phase coding and the following signals are obtained $s_2^*(\tau,t) = -s_1(\tau,-t)$, whereby the sign thereof is changed before associating them with their homolog of the first sequence.

* * * * *